United States Patent
Renneke et al.

(10) Patent No.: US 10,879,879 B2
(45) Date of Patent: Dec. 29, 2020

(54) RELAXATION OSCILLATOR AND METHOD FOR OPERATING A RELAXATION OSCILLATOR

(71) Applicant: Infineon Technologies AG, Neubiberg (DE)

(72) Inventors: Florian Renneke, Münster (DE); Jaafar Mejri, Ottobrunn (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/683,586

(22) Filed: Nov. 14, 2019

(65) Prior Publication Data

US 2020/0162059 A1 May 21, 2020

(30) Foreign Application Priority Data

Nov. 15, 2018 (DE) .................... 10 2018 128 693

(51) Int. Cl.
*H03K 3/0231* (2006.01)
*H03K 4/502* (2006.01)

(52) U.S. Cl.
CPC .......... *H03K 3/0231* (2013.01); *H03K 4/502* (2013.01)

(58) Field of Classification Search
CPC ...... H03K 3/0231; H03K 4/502; H03K 4/501; H03K 3/011; H03K 3/012
See application file for complete search history.

(56) References Cited

U.S. PATENT DOCUMENTS

| | | | |
|---|---|---|---|
| 9,385,649 B2 * | 7/2016 | Wang | H03B 5/04 |
| 2013/0038364 A1 * | 2/2013 | Tokairin | H03L 7/099 327/156 |
| 2020/0044629 A1 * | 2/2020 | Mikulic | H03K 5/135 |

FOREIGN PATENT DOCUMENTS

WO WO-2018077719 A1 * 5/2018 ............. H03K 5/133

* cited by examiner

*Primary Examiner* — Ryan Johnson
(74) *Attorney, Agent, or Firm* — Slater Matsil, LLP

(57) ABSTRACT

A method of operating a relaxation oscillator includes determining a measure of a propagation delay of a detection device of a relaxation oscillator and increasing a charging rate of a capacitor device of the relaxation oscillator for a time duration based on the determined measure of the propagation delay.

18 Claims, 4 Drawing Sheets

RELAXATION OSCILLATOR AND METHOD FOR OPERATING A RELAXATION OSCILLATOR

This application claims the benefit of German Application No. 102018128693.7, filed on Nov. 15, 2018, which application is hereby incorporated herein by reference in its entirety.

TECHNICAL FIELD

The present application relates to relaxation oscillators and to methods for operating such relaxation oscillators.

BACKGROUND

Relaxation oscillators are a type of oscillator which is based on a capacitor device being charged gradually by a current source and then being discharged rapidly when a threshold voltage is reached. A frequency of such a relaxation oscillator is primarily determined by the charging current generated by the current source, the capacitance of the capacitor device and the threshold voltage at which the discharge takes place. One conventional possibility for detecting the reaching of the threshold voltage is the use of a comparator.

Such comparators for detecting the reaching of the threshold voltage have a propagation delay, which influences the frequency of the oscillator. This will be explained briefly with the FIGS. 7 and 8.

FIG. 7 schematically shows the structure of a conventional relaxation oscillator. A capacitor 71 having a capacitance $C_{int}$ is charged by a current source 70 with a charging current $I_{in}$, which leads to an increasing voltage $V_{int}$ at the capacitor 71. This voltage $V_{int}$ is compared by a comparator 73 with a reference voltage $V_r$ (not represented in FIG. 7). When the reference voltage $V_r$ is exceeded, a control pulse 74 is triggered, which closes a switch 72 in order to discharge the capacitor 71. After the end of the pulse, the switch 72 is reopened and the cycle begins again. In this way, a sawtooth oscillating voltage $V_{int}$ is formed.

This behavior is represented in FIG. 8. A curve 80 consisting of curve parts 80A, 80B and 80C in this case shows the time profile of the voltage $V_{int}$.

In curve section 80A, the voltage $V_{int}$ increases because of the charging of the capacitor 71 with the charging current $I_{in}$, until the aforementioned threshold voltage $V_r$ is reached. In an ideal case, the capacitor 71 would then be discharged abruptly by the mechanism described above, so that an ideal oscillator period $T_{ideal}$ corresponds to the time which the voltage $V_{int}$ takes to increase to the value $V_r$.

In the real case, however, the comparator 73 has a comparator propagation delay, i.e. an inherent delay, so that the pulse 74 cannot be output without any time delay when the voltage $V_r$ is reached. Because of this propagation delay, the voltage $V_{int}$ then increases further in the curve part 80B up to a voltage $V_{trig}$, at which the switch 72 is then actually closed.

In a curve part 80C, the capacitor 71 is then discharged. Contrary to the ideal behavior, this discharge likewise takes a certain time duration. Furthermore, the closing and opening of the switch 72 do not take place instantaneously, but rather the switch 72 remains closed for a certain time, determined by a width of the pulse 74.

This gives rise to an overall propagation delay $\Delta t$, the effect of which is that a real period length $T_{real}$ of the relaxation oscillator is $T_{ideal}+\Delta t$.

In many applications, the propagation delay $\Delta t$ varies as a function of various parameters, for example temperature, supply voltage, stray capacitances, process variations, slope of the curve parts 80A, 80B, and other variables such as variations in the charging current or the capacitance value of the capacitor 71. This makes it difficult to generate a precise and stable oscillation frequency which corresponds to the inverse of the period $T_{real}$.

SUMMARY

In accordance with an embodiment, a relaxation oscillator includes a current source for providing a charging current, a capacitor device coupled to the current source, a detection device configured to detect when a voltage at the capacitor device reaches a threshold voltage, and to discharge the capacitor device in response to the detecting that the voltage at the capacitor device has reached the threshold voltage; and a measuring device configured to measure a measure of a propagation delay of the detection device, where the relaxation oscillator is configured to increase a charging rate of the capacitor device for a time duration based on the measure of the propagation delay.

In accordance with another embodiment, a method for operating a relaxation oscillator includes determining a measure of a propagation delay of a detection device of the relaxation oscillator, where the detection device is configured to detect when a voltage at a capacitor device reaches a threshold voltage, and to discharge the capacitor device in response to the detection, and increasing a charging rate of the capacitor device for a time duration based on the determined measure of the propagation delay.

In accordance with a further embodiment, relaxation oscillator includes a first capacitor; a first current source coupled to the first capacitor; a second capacitor; a second current source coupled to the first capacitor; a comparator coupled to the first capacitor and the second capacitor; and a control circuit configured to discharge the first capacitor and set a voltage across the second capacitor to a reference voltage when a the comparator detects that a voltage across the first capacitor reaches a threshold, set a current of the first current source to a first current, and decrease the current of the first current source to a second current when the comparator indicates that a voltage across the second capacitor reaches the threshold.

The summary above serves merely as a brief overview of many exemplary embodiments and is not to be interpreted as restrictive, since other exemplary embodiments may comprise features other than those explained above.

DETAILED DESCRIPTION OF ILLUSTRATIVE EMBODIMENTS

Various exemplary embodiments will be explained in detail below with reference to the appended drawings. These exemplary embodiments serve merely for illustration and are not to be interpreted as restrictive. Features of different exemplary embodiments may be combined with one another in order to form further exemplary embodiments. Variations, modifications and details which are described in relation to one of the exemplary embodiments may also be applied to other exemplary embodiments, and are therefore not described repeatedly.

In the context of this application, unless explicitly indicated otherwise, the expressions "connected" or "coupled" refer to electrical connection or coupling. Connections and/or couplings may be modified so long as the basic function of the connection or coupling is preserved.

Figure 1:
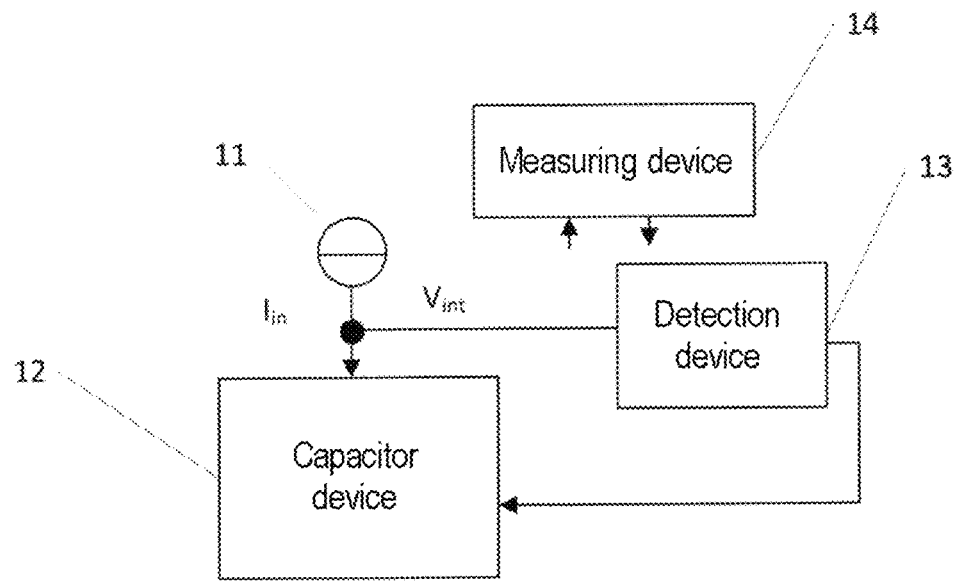
FIG. 1 shows a block diagram of a relaxation oscillator according to one exemplary embodiment.

FIG. 1 shows a relaxation oscillator according to one exemplary embodiment. The relaxation oscillator in FIG. 1 comprises a capacitor device 12, which is charged with a charging current $I_{in}$ by a voltage source 11. A capacitor device is in this case intended to mean a device having one or more capacitors, at least one capacitor of the one or more capacitors being charged by the charging current $I_{in}$. In the case of a plurality of capacitors, these may be connected in parallel or in series or selectively interconnected with one another by means of switches, as will be explained below with the aid of an example with reference to FIGS. 5 and 6.

Because of the charging with the charging current $I_{in}$, the voltage $V_{int}$ at the capacitor device 12 increases. The voltage $V_{int}$ is monitored by a detection device 13, and the detection device 13 causes the capacitor device 12 to be discharged in response to the reaching of a threshold voltage. The detection device 13 may in this case comprise a comparator, as already explained in the introduction with reference to FIG. 7. It is, however, also possible to employ other detection devices which are conventionally used in relaxation oscillators, for example detection devices which contain inverter chains.

Figure 7:
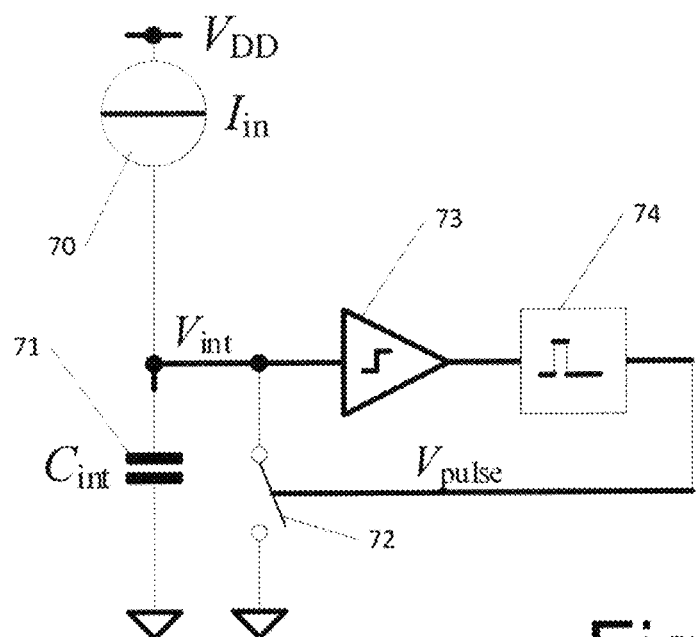
FIG. 7 shows a circuit diagram of a relaxation oscillator according to the prior art.
Figure 8:
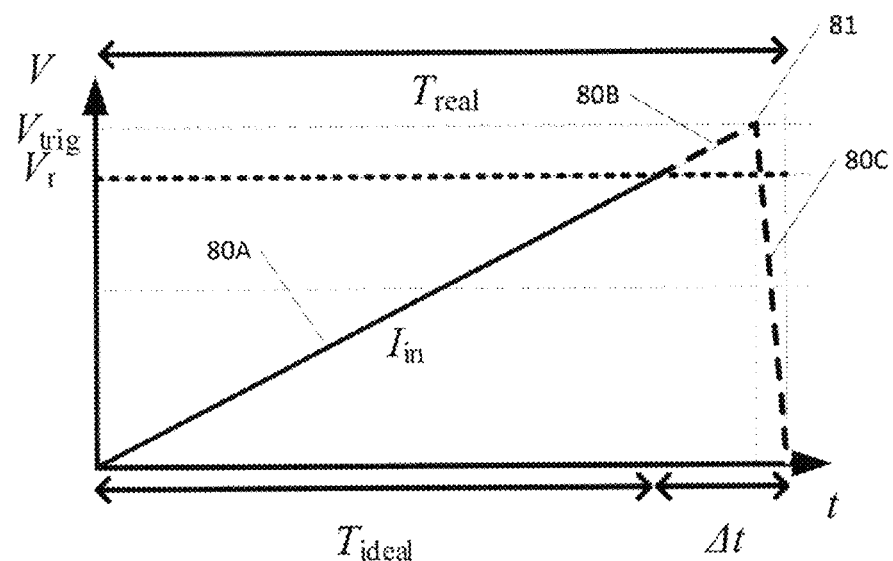
FIG. 8 shows an example of a voltage profile in the relaxation oscillator of FIG. 7.

The detection device 13 has a propagation delay, as explained in the introduction with the aid of FIGS. 7 and 8 for the comparator 73 of FIG. 7. This propagation delay may depend on various parameters, for example temperature, voltage, process variations during the production of the relaxation oscillator, and the like. The propagation delay of the detection device 13 may also contain delays which are caused by a finite discharge time of the capacitor device 12 or by a finite pulse width of signals. In the context of this application, unless explicitly indicated otherwise, the term propagation delay refers to the overall propagation delay of the detection device and comprises, for example, both a comparator propagation delay and other delays, for example due to a finite pulse width of signals as already explained in the introduction for FIG. 7 for the overall propagation delay $\Delta t$.

In order to eliminate or at least reduce the influences of such a propagation delay, the relaxation oscillator of FIG. 1 comprises a measuring device 14, which is adapted to determine a measure of the propagation delay of the detection device 13. A measure of the propagation delay is in this case intended to mean a quantity which directly or indirectly indicates how large the propagation delay is. For example, variations in the propagation delay as a function of the temperature may also be identified from the measure. In other words, the measure is obtained from a direct, or alternatively from an indirect, measurement of the propagation delay. As will be explained below, such an indirect measurement may, for example, be carried out by charging an auxiliary capacitor.

On the basis of the measure of the propagation delay, the measuring device 14 then drives the relaxation oscillator so that it increases a charging rate of the capacitor device 12 for a time duration. The time duration is in this case dictated by the measure of the propagation delay. The charging rate determines how rapidly the voltage $V_{int}$ increases, and may for example be indicated as $dV_{int}/dt$, i.e. the slope of $V_{int}$ as a function of time. The charging rate may in this case be increased by increasing the charging current $I_{in}$ and/or by reducing a capacitance of the capacitor device 12. Examples of these two possibilities will be further explained below.

Because of the increase in the charging rate for a time duration, $V_{int}$ increases more rapidly so that the propagation delay of the detection device 13 may be compensated for fully or partially. In several exemplary embodiments, the charging rate is double for a time duration which corresponds to or comprises the propagation delay. In this way, as will be explained in more detail below, the propagation delay may be compensated for substantially fully. In several exemplary embodiments, the compensation for the propagation delay is in this case carried out with a low current consumption, low costs and simple production of the relaxation oscillator.

Figure 2:
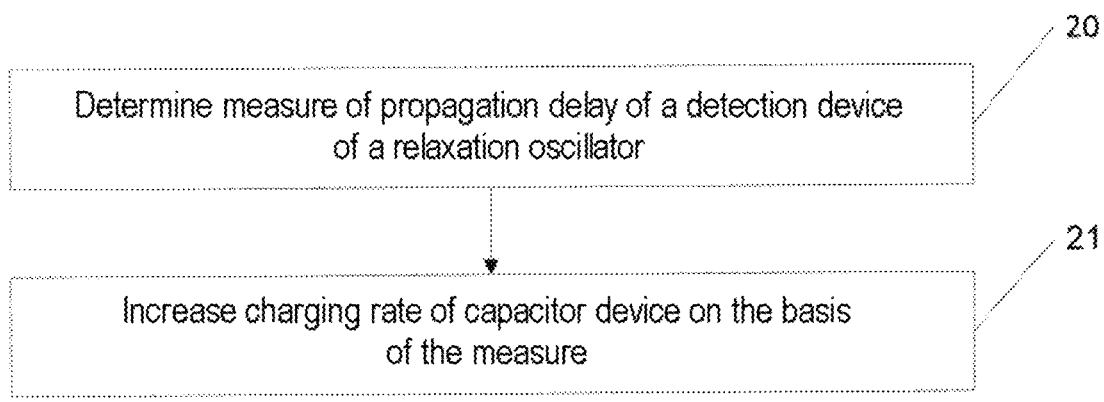
FIG. 2 shows a flowchart to illustrate a method according to one exemplary embodiment.

FIG. 2 shows a flowchart to illustrate a corresponding method. The method of FIG. 2 may be implemented in the relaxation oscillator of FIG. 1, and to avoid repetitions is explained with reference to the above explanation of FIG. 1. The method of FIG. 2 may, however, also be used in relaxation oscillators other than the relaxation oscillator of FIG. 1.

At 20 in the method of FIG. 2, a measure of a propagation delay of a detection device of a relaxation oscillator, for example the detection device 13, is determined. At 21, a charging rate of a capacitor device, for example the capacitor device 12, is increased for a time duration on the basis of the measure, so that the propagation delay can be compensated for fully or partially.

Figure 3:
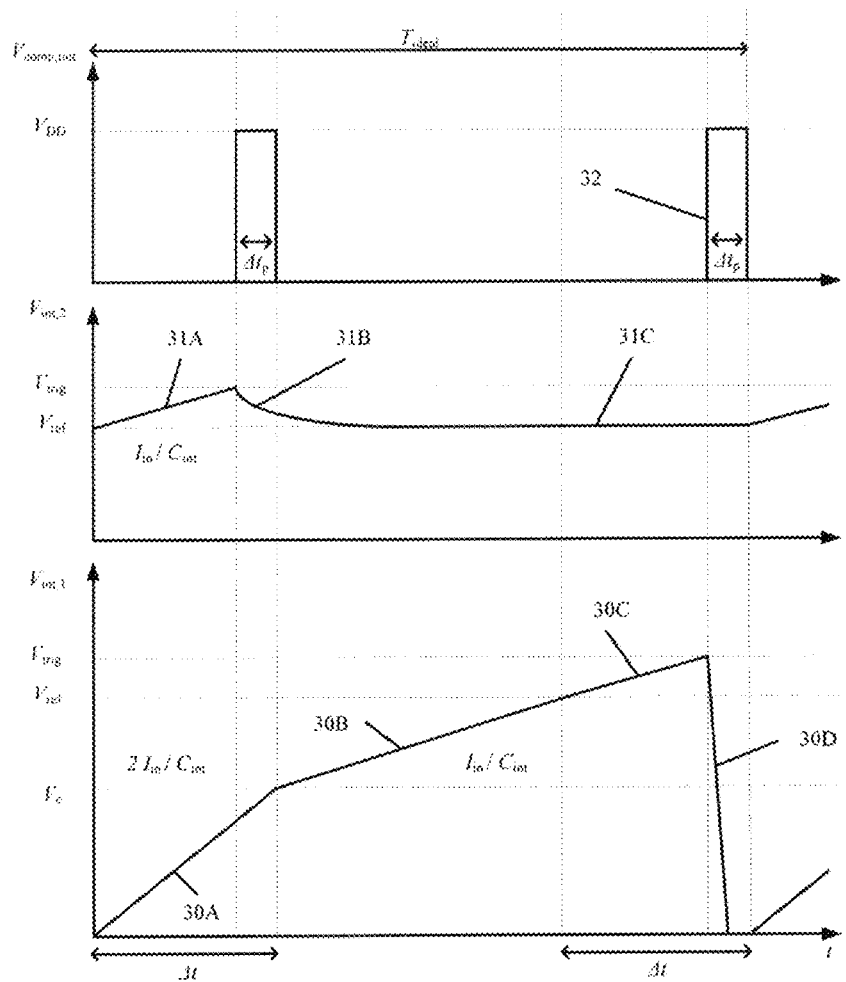
FIG. 3 shows curves to illustrate the functionality of several exemplary embodiments.

This will now be explained further with reference to FIG. 3. In FIG. 3, a curve 30, which is subdivided into sections 30A, 30B, 30C and 30D, shows the profile of a voltage $V_{int}$ of a capacitor device, such as the capacitor device 12, during charging with a charging current. The slope of the charging curve is determined by the quotient of the charging current $I_{in}$ and the capacitance $C_{int}$ of the capacitor device.

In the exemplary embodiment of FIG. 3, the propagation delay of a detection device used is denoted by $\Delta t$. For a time duration $\Delta t$, the charging rate is doubled in the curve section 30A. Following on from the curve section 30A are the curve sections 30B, 30C, in which the charging rate is in turn reduced, i.e. to one half of the charging rate in the curve section 30A. This compensates for the time $\Delta t$, which results from the fact that on the one hand, as in the curve section 30C (corresponding to the explained curve section 80B of FIG. 8), a delay because of the detection device occurs before the start of the discharging of the capacitor device, and because of a finite pulse width $\Delta t_p$ of a signal, as shown in the curve section 30D. Such an increase in the charging rate in the curve section 30A may, for example, be achieved by doubling the charging current $I_{in}$, by halving the capacitance $C_{int}$ or by a combination of an increase in the charging current with a decrease in the capacitance.

It should also be noted that doubling the charging rate for the time duration Δt provides a simple possibility for the compensation. In other exemplary embodiments, however, an increase in the charging rate of less than doubling may for example also be carried out for a time longer than Δt, or a greater increase in the charging rate may also be carried out for a shorter time duration Δt. In this way, an oscillation period may be kept at least approximately at an ideal period $T_{ideal}$.

It should be noted that, in the exemplary embodiments described with reference to FIGS. 1 and 2, variations in Δt, for example due to temperature and voltage changes, may also be compensated for. Furthermore, as already indicated above, not only may the propagation delay of a comparator itself be compensated for, but also in exemplary embodiments the propagation delay of an entire detection device, including for example effects which are due to a finite pulse width $\Delta t_p$ of a pulse for opening and closing a discharge switch, may be compensated for.

Other curves in FIG. 3 relate to exemplary embodiments described in detail below, and will be explained together with them.

Figure 4:
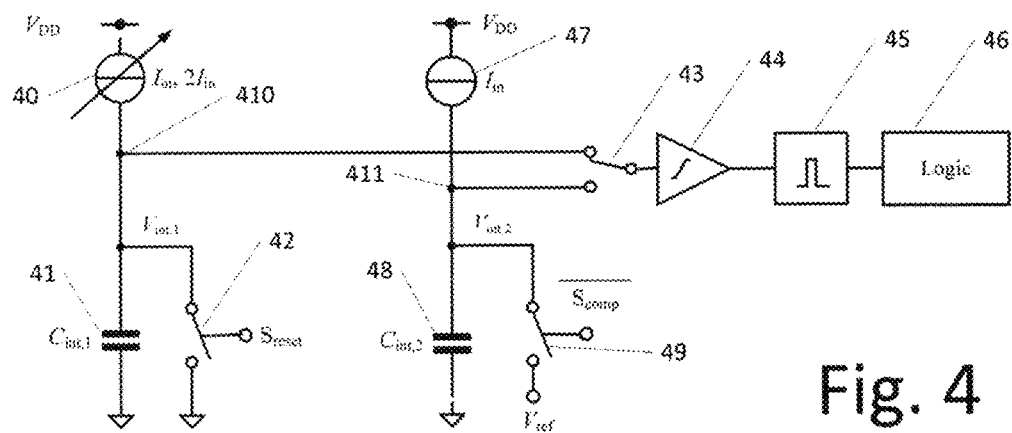
FIG. 4 shows a circuit diagram of a relaxation oscillator according to one exemplary embodiment.

FIG. 4 shows a relaxation oscillator according to one exemplary embodiment, in which doubling of a charging current during a time duration Δt is used.

The relaxation oscillator of FIG. 4 comprises a first current source 40, which provides a charging current for a first capacitor 41. The first capacitor 41 has a capacitance $C_{int,1}$. The current source 40 is in this case variable, so that either a charging current $I_{in}$ or the doubled charging current $2I_{in}$ can be delivered to the capacitor 41. A voltage at the first capacitor 41 is denoted by $V_{int,1}$. The first capacitor 41 is connected to a switch 42. When the switch 42 is closed, the two terminals of the first capacitor 41 are connected to ground, so that the first capacitor 41 is discharged. The switch 42 is in this case controlled by a signal $S_{reset}$. The first capacitor 41 represents an example of a capacitor device.

The relaxation oscillator of FIG. 4 furthermore comprises a second current source 47, which is coupled to a second capacitor 48 in order to charge the latter with the charging current $I_{in}$. The second capacitor 48 has a capacitance $C_{int,2}$, which in the exemplary embodiment of FIG. 4 is equal to the capacitance $C_{int,1}$ of the first capacitor 41, and is jointly denoted by $C_{int}$. In the context of this application, "equal" means "equal to within production tolerances".

A voltage at the second capacitor 48 is denoted by $V_{int,2}$. By means of a switch 49, the capacitor 48 can be precharged to a reference voltage $V_{ref}$. The switch 49 is in this case controlled by a signal $S_{comp}$.

The reference voltage $V_{ref}$ is in this case selected in such a way that it is less than a voltage at which a comparator 44 actually triggers. This voltage is referred to as the trigger voltage $V_{trig}$.

In this case, either a node 410, at which the voltage is $V_{int,1}$, or a node 411, at which the voltage is $V_{int,2}$, may be selectively connected to an input of the comparator 44. The comparator 44 compares the voltage delivered to it in this way with a comparison voltage and, when the comparison voltage is exceeded, with a propagation delay emits a pulse 45 which, as will be explained below, is then used by logic 46 in order to generate the signals $S_{reset}$, $S_{comp}$.

During operation, the capacitor 41 acts so to speak as a "main capacitor" corresponding to the capacitor device 12, which corresponds to the conventional capacitor of a relaxation oscillator and is charged by the current source 40. The second capacitor 48 together with the second current source 47 is used as a measuring device in order to determine measurement of the propagation delay of comparator 44, pulse 45 and logic 46.

The operation of the relaxation oscillator 4 will now be explained with reference to FIG. 3.

FIG. 3 shows a period $T_{ideal}$ of the operation of the relaxation oscillator of FIG. 4.

In this case, the already discussed curve 30 with the curve sections 30A, 30B, 30C and 30D indicates the voltage $V_{int,1}$ at the node 410. A curve 31 with curve sections 31A, 31B, 31C indicates the voltage $V_{int,2}$ at the node 411.

At the start of the period $T_{ideal}$, the node 411 is charged by prior closing of the switch 49 to the voltage $V_{ref}$. The voltage $V_{int,1}$ is at ground potential because of prior closing of the switch 42, that is to say the first capacitor 41 is discharged. The current source 40 generates a charging current $2I_{in}$, and the current source 47 generates a charging current $I_{in}$. The comparator 44 is connected to the node 411 by means of the switch 43.

Accordingly, at the start of the period $T_{ideal}$, the first capacitor 41 is charged with the charging current $2I_{in}$ and the second capacitor 48 is charged with the charging current $I_{in}$. The voltage $V_{int,1}$ therefore increases according to the curve 30A with a slope $2I_{in}/C_{int}$, starting from zero, and the voltage $V_{int,2}$ increases according to the curve section 31A with a slope $I_{in}/C_{int}$, starting from the voltage $V_{ref}$.

The rise in the voltage $V_{int,2}$ finally leads to the comparator 44 detecting exceeding of the threshold voltage of the comparator, when the voltage $V_{trig}$ is reached. As already explained above, this voltage $V_{trig}$ does not correspond to the threshold voltage which is applied to the comparator 44, for example as a reference, but is higher than this because of propagation delays. An output signal of the comparator 44 is represented as an output voltage $V_{CMP,out}$ in a curve 32. When the curve 31A reaches the trigger voltage $V_{trig}$, the pulse 45 is generated with a pulse width $\Delta t_p$ represented in FIG. 3.

On the basis of the pulse 45, the capacitor is discharged by closing the switch 49, so that the voltage $V_{int,2}$ decreases to $V_{ref}$, as shown in the curve section 31B, 31C. Furthermore, in response to the pulse 45, the switch 43 is switched by the logic 46 so that the node 410 is connected to the comparator 44. At the end of the pulse, that is to say at the end of the duration $\Delta t_p$, the current delivered by the current source 40 is furthermore switched from $2I_{in}$ to $I_{in}$.

The effect of this is that the voltage $V_{int,1}$ now increases with the slope $I_{in}/C_{int}$ in the curve sections 30B and 30C, and the voltage $V_{int,2}$ decreases back to the voltage $V_{ref}$, that is to say the second capacitor 48 is correspondingly precharged for the next period $T_{ideal}$.

When the voltage $V_{int,1}$ reaches the voltage $V_{trig}$, the comparator 44 again generates a pulse 45 of the width $\Delta t_p$. In response to the pulse, the switch 42 is closed in order to discharge the capacitor. At the end of this pulse, the period $T_{ideal}$ is ended and the next period begins.

In this case, the time duration from the start of the period $T_{ideal}$ until the end of the first pulse of width $\Delta t_p$, which is triggered after the voltage $V_{int,2}$ reaches the threshold voltage, is equal to the time duration from the instant at which the voltage $V_{int,1}$ reaches the voltage $V_{ref}$ until the end of the second pulse of width $\Delta t_p$, which is triggered by the comparator 44 in response to the reaching of $V_{trig}$ by $V_{int,1}$. Both time durations are denoted in FIG. 3 by Δt, and as explained above correspond to the propagation delay from the reaching of $V_{ref}$ until the end of the respective pulse of pulse duration $\Delta t_p$. Since the capacitor 41 is charged at two times the charging rate during the first time duration Δt compared with the rest of the period $T_{ideal}$ (achieved in this case by the doubled charging current) the second time duration $\Delta t_p$ is therefore compensated for in the period $T_{ideal}$. In other words, the time duration $T_{ideal}$ is equal to $$T_{ideal} = \frac{C_{int} V_c}{2 I_{in}} + \frac{C_{int}(V_{ref} - V_c)}{I_{in}} + \Delta t$$

where $V_C$, as can be seen from FIG. 3, is the voltage that the voltage $V_{int,1}$ has reached at the end of the first time duration $\Delta t$, that is to say at the end of the charging with the doubled charging current $2I_{in}$. The first term on the right-hand side of Equation (1) in this case corresponds to the time of curve 30A, the second term corresponds to the duration of the curve of the curve section 30B, and the third term corresponds to the duration of the curve sections 30C and 30D. On the other hand, $$V_c = \frac{2 I_{in} \Delta t}{C_{int}} \qquad (2)$$

applies, which may likewise be seen from FIG. 3, so that the following applies overall $$T_{ideal} = \frac{C_{int} V_{ref}}{I_{in}}. \qquad (3)$$

The period $T_{ideal}$ thus corresponds to a period of a relaxation oscillator, during which the capacitor 41 is charged with the constant charging current $I_{in}$ and the discharge takes place without a time delay precisely at the voltage $V_{ref}$. In other words, the period $T_{ideal}$ corresponds to the period of an "ideal" relaxation oscillator of FIG. 8, for which $\Delta t$ is equal to zero and $V_r$ is equal to $V_{ref}$.

In this case, substantially all changes in $\Delta t$, for example because of temperature-dependent changes in the propagation time of the comparator 44, changes in the pulse duration of the pulse 45, process variations and the like, are compensated for. With reference to FIG. 1, in the exemplary embodiment of FIG. 4 a measure of the propagation delay (namely the first $\Delta t$ of FIG. 3) is thus measured by the second capacitor 48, and during this time the charging rate is doubled (in this case by increasing the charging current for the first capacitor 41 during the first time duration $\Delta t$ of FIG. 3).

Besides increasing the charging current, in addition or as an alternative the charging rate may also be achieved by reducing the capacitance. Examples of reducing the capacitance in order to increase the charging rate will be explained below with reference to FIGS. 5 (5A and 5B) and 6. In this case, one possible procedure will initially be explained with reference to FIGS. 5A and 5B and then a possible circuit technology embodiment of such a procedure will be described with reference to FIG. 6. In order to avoid repetitions, reference will furthermore be made to the exemplary embodiments described above.

Figures 5A, 5B:
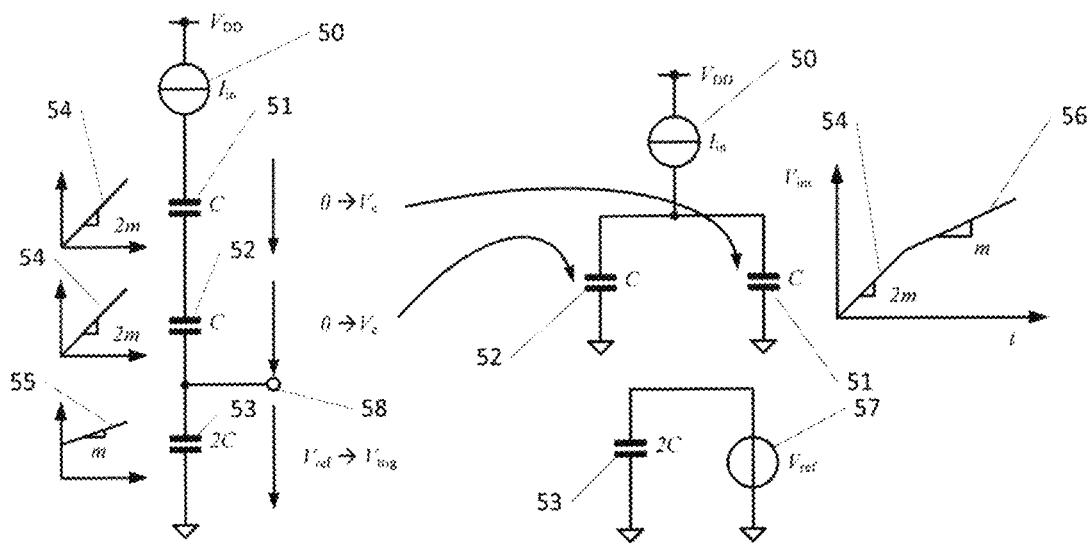
FIGS. 5A and 5B illustrate the functionality of relaxation oscillators according to several exemplary embodiments.

In the exemplary embodiment of FIGS. 5A and 5B, three capacitors 51, 52 and 53 are used. The capacitors 51 and 52 have a capacitance C, and the capacitor 53 has two times the capacitance 2C in comparison thereto. Values of C may for example lie in the range of from 100 fF to 1 pF, but are not restricted thereto. Furthermore, the apparatus comprises a current source 50 for generating a charging current $I_{in}$. The capacitors 51, 52 are in this case used as a "main capacitor" of the relaxation oscillator (substantially corresponding to the capacitor device 12 of FIG. 1 or the capacitor 41 of FIG. 4), while the capacitor 53 is used to determine a measure of the propagation delay corresponding to the capacitor 48 of FIG. 4.

In order to describe the behavior of the exemplary embodiment of FIGS. 5A and 5B, reference will now again be made to FIG. 3.

At the start of a period $T_{ideal}$, the capacitor 53 is precharged via a node 58 to a voltage $V_{ref}$. The capacitors 51, 52 are precharged to a differential voltage of zero. This is achieved by the capacitors 51, 52 in the discharged state being connected in series with the capacitor 53, as shown in FIG. 2. In this way, all the capacitor plates of the capacitors 51, 52 are at the voltage $V_{ref}$, and the voltage difference across these capacitors 51, 52 is zero.

The capacitors 51, 52 and 53 connected in series are then all charged by means of the current source 50 with the charging current $I_{in}$. By the charging current $I_{in}$, the capacitor 53 is then charged starting from the voltage $V_{ref}$ and the capacitors 51, 52 are charged starting from zero. In this case, the charging rate (slope of the voltage at the respective capacitor as a function of time) for the capacitor 53 is half as great because of its doubled capacitance 2C as for the capacitors 51, 52. This is illustrated by curves 54 for the capacitors 51, 52 and a curve 55 for the capacitor 53, m being the slope, which for the curves 54 is two times as great (2 m) as for the curve 55.

The voltage at the node 58, that is to say the voltage at the capacitor 53, is monitored by a detection device such as a comparator, and when a trigger voltage $V_{trig}$ is reached the configuration shown in FIG. 5B is changed to. Before the trigger voltage $V_{trig}$ is reached and a subsequent reconfiguration (for example end of a comparator pulse $\Delta t_p$), the time duration $\Delta t$ has elapsed corresponding to the propagation delay and the capacitors 51, 52 have then respectively reached a voltage $V_e$, corresponding to the curve section 30A of FIG. 3.

In the configuration of FIG. 5B, the capacitor 53 is again charged to $V_{ref}$ by its being connected to a corresponding voltage source 57, substantially corresponding to the curve section 31C of FIG. 3.

The capacitors 51, 52 are then connected in parallel. The capacitors 51, 52 therefore form an overall capacitance 2C, so that the charging rate is halved to m, as represented by a curve 56 in FIG. 5B. After the time duration $\Delta t$ has elapsed, the capacitance formed by the capacitors 51, 52 in the parallel circuit therefore have the same value as the capacitance of the capacitor 53. This again corresponds to the situation in FIG. 3 in the curve sections 30B and 30C, where the charging rate is likewise halved in relation to the curve section 30A. When the trigger voltage is reached at the parallel circuit of the capacitors 51, 52, these are then discharged (corresponding to the curve section 30D of FIG. 3), i.e. they are brought to a potential difference of zero between their plates, and in this discharged state are then once more connected in series as in FIG. 5A to the capacitor 53, and the next period begins. The basic functionality of the exemplary embodiment of FIGS. 5A and 5B therefore corresponds to the functionality of the exemplary embodiment of FIG. 4, with the difference that different charging currents $I_{in}$, $2I_{in}$ are not used, but instead a selective series or parallel connection of the capacitors 51, 52, so as to change the charging rate.

In the exemplary embodiment of FIGS. 5A and 5B, only a single current source 50 is required compared with the current sources 40, 47 of FIG. 4. On the other hand, one more capacitor and corresponding switches for setting up the various configurations are required, which are not required in the exemplary embodiment of FIG. 4.

Figure 6:
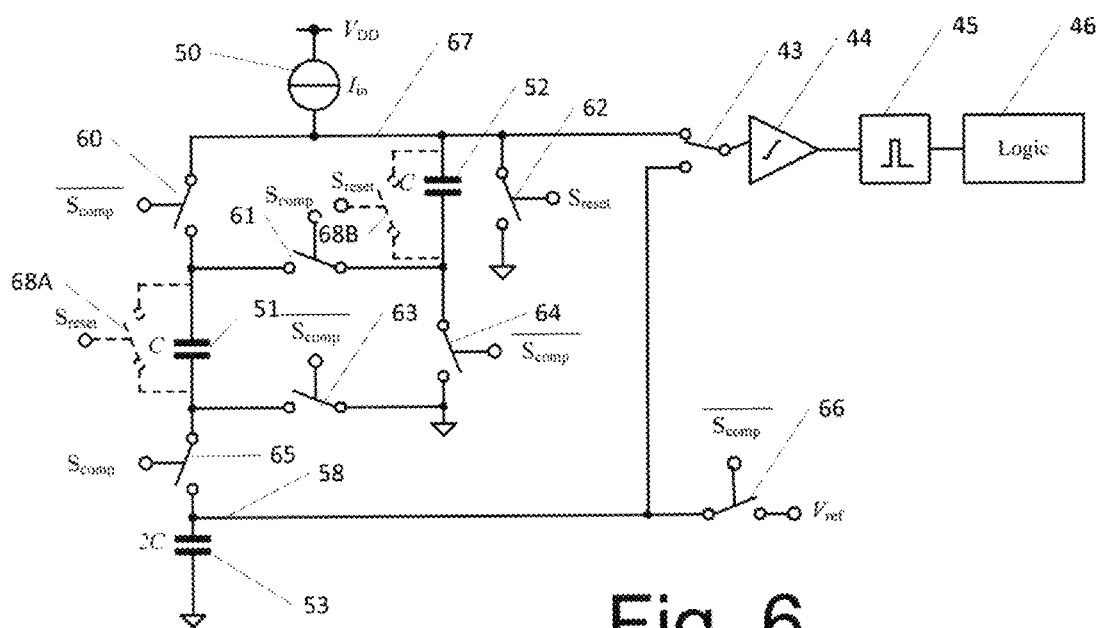
FIG. 6 shows a circuit diagram of a relaxation oscillator according to one exemplary embodiment.

One possible circuit technology embodiment of the exemplary embodiment of FIGS. 5A and 5B is shown in FIG. 6.

The capacitors 51, 52, 53 of FIG. 6, as well as the nodes 58 and the current source 50, bear the same references as in FIGS. 5A and 5B and will not be explained again. Substantially the same components as in FIG. 4 are used as the detection device, and likewise bear the same references, that is to say a comparator 44, which generates a pulse 45 that is then processed by logic 46. By means of a switch 43, the comparator 44 can be connected selectively to the node 58 or a node 67.

The switches 60, 61 and 63-66 are controlled by a signal $S_{comp}$, the switches to which the signal $\overline{S_{comp}}$ is delivered having the opposite behavior to the switches which are denoted by $S_{comp}$ as in FIG. 6.

For the configuration of FIG. 5A, in the exemplary embodiment of FIG. 6 the switches 61 and 65 are closed and the other switches are opened. The switch 43 connects the comparator 44 to the node 58. When the voltage at the node 58 then reaches the trigger voltage $V_{trig}$, the comparator 44 triggers the pulse 45 as already explained with reference to FIGS. 3, 5A and 5B. Following this, the switches 61 and 65 are opened and the switches 60o, 63, 64 and 66 are closed. The configuration of FIG. 5B is therefore obtained. In this stage, the switch 43 connects the comparator 44 to the node 67. When the voltage at the node 67 then reaches the trigger voltage, a pulse 45 is again generated and, by closing the switch 62, the capacitors 51, 52 are discharged according to the curve section 30B of FIG. 3. As an alternative or in addition to the switch 62, switches 68A, 68B may also be provided in parallel with the capacitors 51, 52 in order to discharge the latter.

The circuit technology embodiment of FIG. 6 in this case only represents an example, and other switch configurations may also be used. Furthermore, the procedures of FIGS. 4, 5 and 6 may in principle also be combined, that is to say in order to increase the charging rate both the charging current may be increased and the capacitance may be reduced.

It should be noted that in principle, instead of a single comparator 44 with the switch 43, it is also possible to use two separate comparators of the same design. The use of a single comparator may, however, have the advantage that no effects which are due to differences between the comparators, for example because of production tolerance, occur. It should furthermore be noted that the current source 11 and capacitor device 12 which are shown in FIG. 1, the current sources 40, 47 and capacitors 41, 48 which are shown in FIG. 4, and the current source 50 and the capacitors 51-53 which are shown in FIGS. 5A, 5B and 6 may also be configured as so-called dynamic element matching current sources or dynamic element matching capacitors, respectively. To this end, a plurality of current sources and capacitors are provided, which are used alternately so as substantially to provide averaging. In this case, a number of capacitors used may in principle be increased arbitrarily. This may also have advantages in implementations with relatively short oscillator periods and advantages in terms of the design of time-critical circuits, for example the logic. If, for example, different capacitors are used alternately in successive periods, it is not necessary to conclude a discharging process (curve section 30D of FIG. 3) or a charging process to the reference voltage (curve section 31C of FIG. 3) before the immediately following period, since other capacitors are then used in this case. It is also possible to produce a multiphase oscillator with a plurality of capacitors which are charged with a time offset.

Relaxation oscillators as described may, for example, be used as current-frequency converters with which an input current is "converted" into an output frequency of the relaxation oscillator. To this end, the charging current $I_{in}$ is generated as a function of the input current, for example by means of a current mirror. In order to switch over between $I_{in}$ and $2I_{in}$ in the exemplary embodiment of FIG. 4, an adjustably current mirror may then correspondingly be used. Such current-frequency converters may, for example, be used as analog-digital converters in which the analog input current is converted into a numerical value that is determined by counting output pulses of the oscillator, or as a current-controlled oscillator in which the output frequency of the relaxation oscillator depends on the input current.

Some exemplary embodiments will be defined by the examples below:

Example 1

A relaxation oscillator, comprising:
a current source for providing a charging current,
a capacitor device coupled to the current source, a detection device, which is adapted to detect when a voltage at the capacitor device reaches a threshold voltage, and to discharge the capacitor device in response to the reaching of the threshold voltage, and
a measuring device, which is adapted to measure a measure of a propagation delay of the detection device, wherein the relaxation oscillator is adapted to increase a charging rate of the capacitor device for a time duration which is based on the measure of the propagation delay.

Example 2

The relaxation oscillator according to Example 1, wherein the time duration corresponds to a duration of the propagation delay, and wherein the increase in the charging rate is doubling of the charging rate.

Example 3

The relaxation oscillator according to Example 1 or 2, wherein the relaxation oscillator is adapted to increase the charging current for the increase in the charging rate for the time duration.

Example 4

The relaxation oscillator according to one of Examples 1-3, wherein the relaxation oscillator is adapted to reduce a capacitance of the capacitor device for the increase in the charging rate for the time duration.

Example 5

The relaxation oscillator according to one of Examples 1-4, wherein the measuring device comprises a further capacitor device, the measuring device being adapted to determine the measure on the basis of a charging process of the further capacitor device.

Example 6

The relaxation oscillator according to Example 5, wherein the measuring device is adapted to precharge the further capacitor device to a reference voltage before the charging process of the further capacitor device.

Example 7

The relaxation oscillator according to Example 5 or 6, wherein the further capacitor device and the capacitor device can be coupled selectively to the detection device, the measure being based on the reaching of the threshold voltage by a further voltage at the further capacitor device.

Example 8

The relaxation oscillator according to one of Examples 5 and 6, wherein the further capacitor device is coupled to a further detection device, which is adapted to detect when a voltage at the further capacitor device reaches a further threshold voltage, and to determine the measure on the basis of the reaching of the further threshold voltage.

Example 9

The relaxation oscillator according to one of Examples 5-8, wherein the measuring device comprises a further current source for generating a further charging current for the further capacitor device.

Example 10

The relaxation oscillator according to Example 9, wherein the further current source is implemented as a dynamic element matching current source.

Example 11

The relaxation oscillator according to one of Examples 5-8, wherein the relaxation device is adapted to couple the further capacitor device in series with the capacitor device during the time duration and to separate it from the capacitor device when the time duration has elapsed.

Example 12

The relaxation oscillator according to Example 11, wherein a capacitance of the further capacitor device is equal to a capacitance of the capacitor device outside the time duration.

Example 13

The relaxation oscillator according to one of Examples 5-12, wherein the further capacitor device is implemented as a dynamic element matching capacitor device.

Example 14

The relaxation oscillator according to one of Examples 1-11, wherein the current source is implemented as a dynamic element matching current source.

Example 15

The relaxation oscillator according to one of Examples 1-14, wherein the capacitor device is implemented as a dynamic element matching capacitor device.

Example 16

A method for operating a relaxation oscillator, comprising:

determining a measure of a propagation delay of a detection device of a relaxation oscillator, the detection device being adapted to detect when a voltage at a capacitor device reaches a threshold voltage, and to discharge the capacitor device in response to the detection, and increasing a charging rate of the capacitor device for a time duration on the basis of the measure.

Example 17

The method according to Example 16, wherein the time duration corresponds to a duration of the propagation delay, and wherein the increase in the charging rate is doubling of the charging rate.

Example 18

The method according to Example 16 or 17, wherein the increase in the charging rate for the time duration comprises an increase in the charging current.

Example 19

The method according to one of Examples 16-18, wherein the increase in the charging rate for the time duration comprises a reduction of a capacitance of the capacitor device.

Example 20

The method according to one of Examples 16-19, wherein the determination of the measure is based on a charging process of a further capacitor device.

Example 21

The method according to Example 20, furthermore comprising:

precharging the further capacitor device to a reference voltage before the charging process of the further capacitor device.

Example 22

The method according to Example 20 or 21, furthermore comprising:

selectively coupling the further capacitor device and the capacitor device to the detection device, the measure being based on the reaching of the threshold voltage by a further voltage at the further capacitor device.

Example 23

The method according to one of Examples 20-22, furthermore comprising:

coupling the further capacitor device in series with the capacitor device during the time duration, and separating the further capacitor device from the capacitor device after the time duration has elapsed.

Although specific exemplary embodiments have been illustrated and described in this description, persons with usual technical knowledge will understand that many alternative and/or equivalent implementations may be selected as a substitute for the specific exemplary embodiments which are presented and described in this description, without departing from the scope of the invention presented. The intention is that this application includes all adaptations or variants of the specific exemplary embodiments which are discussed here. The invention is therefore meant only to be restricted by the claims and the equivalents of the claims.

What is claimed is:

1. A relaxation oscillator, comprising:
a current source for providing a charging current;
a capacitor device coupled to the current source;
a detection device configured to detect when a voltage at the capacitor device reaches a threshold voltage, and to discharge the capacitor device in response to the detecting that the voltage at the capacitor device has reached the threshold voltage; and
a measuring device configured to measure a measure of a propagation delay of the detection device, wherein the relaxation oscillator is configured to increase a charging rate of the capacitor device for a time duration based on the measure of the propagation delay, wherein the relaxation oscillator is configured to reduce a capacitance of the capacitor device for the increase in the charging rate for the time duration.

2. The relaxation oscillator as claimed in claim 1, wherein
the time duration corresponds to a duration of the propagation delay; and
the increase in the charging rate is twice the charging rate.

3. The relaxation oscillator as claimed in claim 1, wherein the relaxation oscillator is further configured to increase the charging current for the increase in the charging rate for the time duration.

4. The relaxation oscillator as claimed in claim 1, wherein the measuring device comprises a further capacitor device, and the measuring device is configured to measure the measure of the propagation delay based on a charging process of the further capacitor device.

5. The relaxation oscillator as claimed in claim 4, wherein the measuring device is configured to precharge the further capacitor device to a reference voltage before the charging process of the further capacitor device.

6. The relaxation oscillator as claimed in claim 4, wherein:
the further capacitor device and the capacitor device are coupled selectively to the detection device; and
the measuring device is configured to measure the measure of the propagation delay based on a further voltage at the further capacitor device reaching the threshold voltage.

7. The relaxation oscillator as claimed in claim 4, wherein:
the further capacitor device is coupled to a further detection device, and
the further detection device is configured to detect when a voltage at the further capacitor device reaches a further threshold voltage, and
the measuring device is further configured to measure the measure of the propagation delay based on the further detection device detecting that the voltage at the further capacitor device has reached the further threshold voltage.

8. The relaxation oscillator as claimed in claim 4, wherein the measuring device comprises a further current source for generating a further charging current for the further capacitor device.

9. The relaxation oscillator as claimed in claim 4, wherein the relaxation oscillator is configured to couple the further capacitor device in series with the capacitor device during the time duration and to separate it from the capacitor device when the time duration has elapsed.

10. The relaxation oscillator as claimed in claim 9, wherein a capacitance of the further capacitor device is equal to a capacitance of the capacitor device outside the time duration.

11. The relaxation oscillator as claimed in claim 1, wherein:
the current source is implemented as a dynamic element matching current source; or
the capacitor device is implemented as a dynamic element matching capacitor device.

12. A method for operating a relaxation oscillator, comprising:
determining a measure of a propagation delay of a detection device of the relaxation oscillator, wherein the detection device is configured to detect when a voltage at a capacitor device reaches a threshold voltage, and to discharge the capacitor device in response to the detection, and wherein the determination of the measure is based on a charging process of a further capacitor device; and
increasing a charging rate of the capacitor device for a time duration based on the determined measure of the propagation delay; and
selectively coupling the further capacitor device and the capacitor device to the detection device, wherein the measure of the propagation delay is based on a further voltage at the further capacitor device reaching the threshold voltage.

13. The method as claimed in claim 12, further comprising precharging the further capacitor device to a reference voltage before the charging process of the further capacitor device.

14. The method as claimed in claim 12, wherein the time duration corresponds to a duration of the propagation delay, and wherein the increase in the charging rate is twice the charging rate.

15. The method as claimed in claim 12, wherein increasing the charging rate for the time duration comprises increasing a charging current provided to the capacitor device or reducing a capacitance of the capacitor device.

16. The method as claimed in claim 12, further comprising:
coupling the further capacitor device in series with the capacitor device during the time duration; and
separating the further capacitor device from the capacitor device after the time duration has elapsed.

17. A relaxation oscillator comprising:
a first capacitor;
a first current source coupled to the first capacitor;
a second capacitor;
a second current source coupled to the second capacitor;
a comparator having an input selectably coupled to the first capacitor and the second capacitor; and
a control circuit configured to:
disconnect the input of the comparator from the second capacitor, and connect the input of the comparator to the first capacitor,
discharge the first capacitor and set a voltage across the second capacitor to a reference voltage when the comparator detects that a voltage across the first capacitor reaches a threshold,
set a current of the first current source to a first current,
disconnect the input of the comparator from the first capacitor, and connect the input of the comparator to the second capacitor, and decrease the current of the first current source to a second current when the comparator detects that the voltage across the second capacitor reaches the threshold.

18. A relaxation oscillator, comprising:
a current source for providing a charging current;
a capacitor device coupled to the current source;
a detection device configured to detect when a voltage at the capacitor device reaches a threshold voltage, and to discharge the capacitor device in response to the detecting that the voltage at the capacitor device has reached the threshold voltage; and
a measuring device configured to measure a measure of a propagation delay of the detection device, wherein the relaxation oscillator is configured to increase a charging rate of the capacitor device for a time duration based on the measure of the propagation delay, wherein:
  the measuring device comprises a further capacitor device, and the measuring device is configured to measure the measure of the propagation delay based on a charging process of the further capacitor device,
  the further capacitor device and the capacitor device are coupled selectively to the detection device, and
  the measuring device is configured to measure the measure of the propagation delay based on a further voltage at the further capacitor device reaching the threshold voltage.

* * * * *